United States Patent [19]
Fukumoto et al.

[11] Patent Number: 5,602,551
[45] Date of Patent: Feb. 11, 1997

[54] ANALOG-TO-DIGITAL CONVERTER WITH SILICON-ON-INSULATOR STRUCTURE

[75] Inventors: Harutsugu Fukumoto, Anjo; Kohji Ichikawa, Obu, both of Japan

[73] Assignee: Nippondenso Co., Ltd., Kariya, Japan

[21] Appl. No.: 318,541

[22] Filed: Oct. 5, 1994

[30] Foreign Application Priority Data

Oct. 6, 1993 [JP] Japan .................................. 5-250746

[51] Int. Cl.[6] ........................... H03M 1/36; H01L 21/76; H01L 29/68
[52] U.S. Cl. ..................... 341/136; 341/158; 341/159; 257/318
[58] Field of Search ..................... 341/136, 155, 341/159; 257/213, 217, 288, 318, 350, 351, 354, 358, 364, 365, 401, 379, 536; 327/288, 328, 394, 404, 408, 564, 565, 566

[56] References Cited

U.S. PATENT DOCUMENTS 4,872,010  10/1989  Larson et al. ........................... 341/136
5,134,456  7/1992  Kobatake ................................ 357/41

FOREIGN PATENT DOCUMENTS 5203681  8/1993  Japan .

OTHER PUBLICATIONS

Shibata et al. *An Intelligent MOS Transistor Featuring Gate-Level Weighted Sum And Threshold Operations*, IEEE International Electron Devices Meeting, Dec. 8–11, 1991, vol. IEDM 91, pp. 919–922.

Silburt et al. *A Novel Multiple Threshold MOSFET Structure for A/D and D/A Conversion*, IEEE Journal of Solid-State Circuits, vol. SC-19, No. 5 pp. 794–802, Oct. 1984.

*Primary Examiner*—Howard L. Williams
*Attorney, Agent, or Firm*—Cushman, Darby & Cushman IP Group of Pillsbury Madison & Sutro LLP

[57] ABSTRACT

A converter is provided having a layout which can be easily designed and which requires a small chip area. Four MOS transistors having the same layout are disposed on the same substrate, and a polycrystalline silicon layer extends under the MOS transistors in the substrate. A predetermined voltage is applied to the polycrystalline silicon layer. This applied voltage continuously controls threshold voltages of the MOS transistors. An analog signal is input to gate terminals of the MOS transistors and is digitized in accordance with on and off states of the MOS transistors.

14 Claims, 12 Drawing Sheets

ANALOG-TO-DIGITAL CONVERTER WITH SILICON-ON-INSULATOR STRUCTURE

CROSS REFERENCE TO RELATED APPLICATION

This application claims the benefit of priority of the prior Japanese patent application No. 5-250746 filed on Oct. 6, 1993, the content of which is incorporated herein by reference.

BACKGROUND OF THE INVENTION

1. Field of the Invention

The present invention relates to converters and, more particularly, to a converter which can be used as, for example, a flash-type A-D converter.

2. Description of the Related Arts

In order to change a threshold voltage Vt of a flash-type inverter utilizing a CMOS, a gate length (L) and a gate width (W) of a transistor therein have been changed (refer to, for example, "A-D Converters Principally Comprised of a CMOS Inverter", C-608, 1982 Spring Convention, Congress on Electronic Information Communication or unexamined Japanese patent publication (KOKAI) No. H5-203681).

Providing a multiplicity of transistors having different gate lengths and gate widths on a single substrate makes the layout design complicated. Further, in order to provide a multiplicity of transistors having different gate lengths and gate widths on the same substrate, the minimum design rules must be applied to the smallest transistor, which results in a problem that a surface area of the chip must be increased to provide transistors of larger sizes.

SUMMARY OF THE INVENTION

It is an object of the present invention to provide a converter whose layout can be easily designed and which has a small chip area.

According to an aspect of the present invention, there is provided a converter wherein a plurality of MOS transistors having the same structure and design are disposed on the same substrate; a conductive layer extends under the MOS transistors on the substrate; threshold voltages of the MOS transistors are continuously controlled by applying a predetermined voltage to the conductive layer; and an analog signal is input to gate terminals of the MOS transistors and is digitized in accordance with on and off states of the MOS transistors.

According to the present invention, by applying the predetermined voltage to the conductive layer, substrate potentials of the MOS transistors are continuously controlled and the threshold voltages of the MOS transistors are continuously controlled. If the analog signal is input to the gate terminals of the MOS transistors in such a state, the on and off states of the MOS transistors change despite of the fact that the gate voltages remain unchanged, and the signal is digitized in accordance with the on and off states. Thus, MOS transistors having the same structure and design can be provided on the same substrate. This facilitates the designing of the layout and allows the minimum design rules to be applied to the MOS transistors of the same design thereby reducing the chip area.

DETAILED DESCRIPTION OF THE EMBODIMENTS (First Embodiment)

A first embodiment of the present invention will now be described with reference to the accompanying drawings.

An example of an application of MOS transistors having a thin film SOI structure to a two-bit analog-to-digital converter will now be described.

Figure 1:
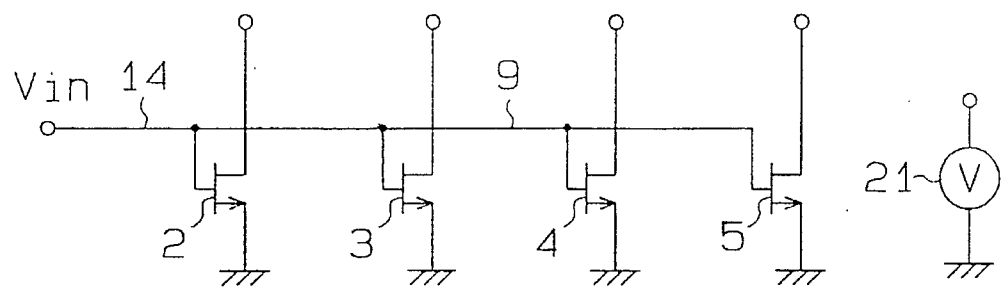
FIG. 1 is an electrical circuit diagram showing an electrical configuration of a first embodiment of the present invention.
Figure 2:
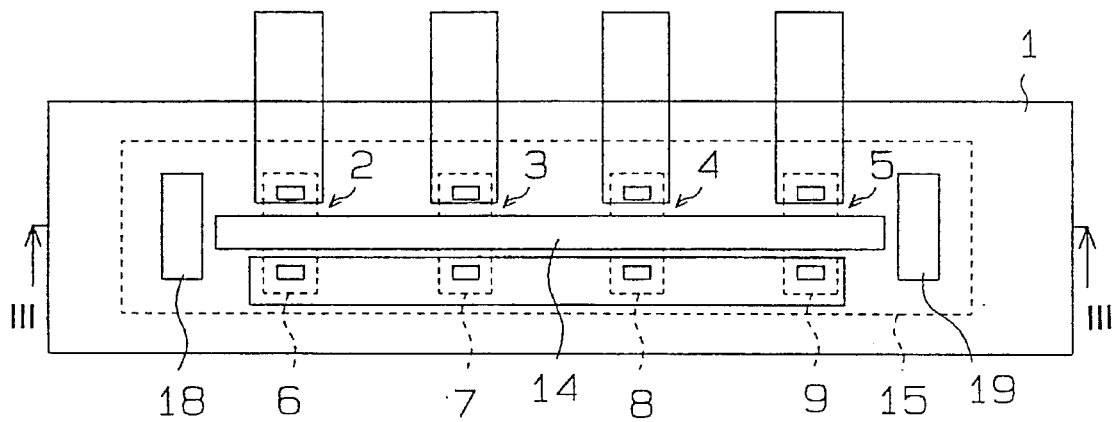
FIG. 2 is a plan view of a chip according to the first embodiment.
Figure 3:
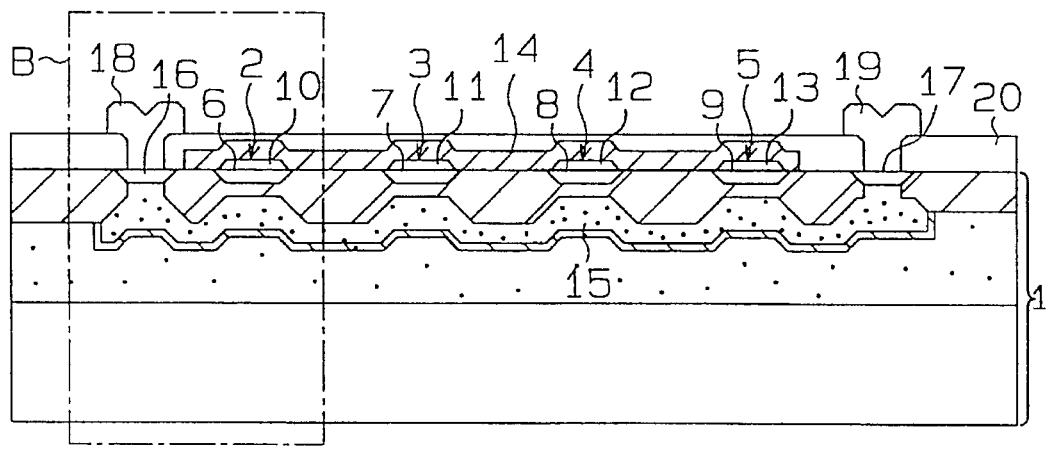
FIG. 3 is a sectional view taken along the line III—III in FIG. 2.

FIG. 1 shows an electrical configuration. FIG. 2 shows a plan view of a substrate. FIG. 3 shows a sectional view taken along the line III—III in FIG. 2.

As shown in FIG. 3, four N-channel type MOS transistors 2, 3, 4 and 5 having the same structure are provided in a line on a substrate 1. Specifically, four thin film silicon layers (thin film SOIs) 6, 7, 8 and 9 are provided on the surface of the substrate 1, and a common gate electrode 14 common to those transistors extends on the thin film silicon layers 6, 7, 8 and 9 with gate oxide films 10, 11, 12 and 13 interposed therebetween. The N-channel type MOS transistors 2, 3, 4 and 5 are arranged at equal intervals.

A polycrystalline silicon layer 15 as a conductive layer extends under the N-channel type MOS transistors 2, 3, 4 and 5 in the substrate 1. One end of this polycrystalline silicon layer 15 is connected to a thin film silicon layer (thin film SOI) 16, and the other end thereof is connected to a thin film silicon layer (thin film SOI) 17. Further, the thin film silicon layers 16 and 17 are connected to aluminum electrodes 18 and 19, respectively.

The surface of the substrate 1 is covered by a BPSG film 20.

In order to fix substrate potentials of the N-channel type MOS transistors 2, 3, 4 and 5, a ground potential is provided at the aluminum electrode 18, and the aluminum electrode 19 is connected to a bias power supply 21 (see FIG. 1). In the present embodiment, a constant power supply of −6 volts is used as the bias power supply 21.

Figure 4:
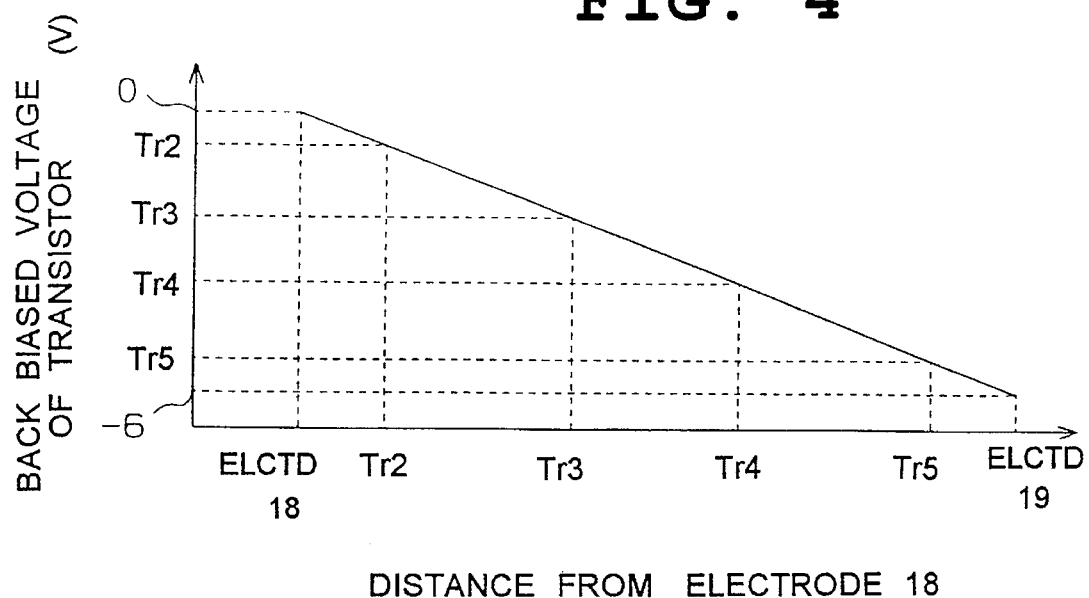
FIG. 4 is a characteristic diagram showing the relationship between the positions and back biased potentials of transistors.
Figure 5:
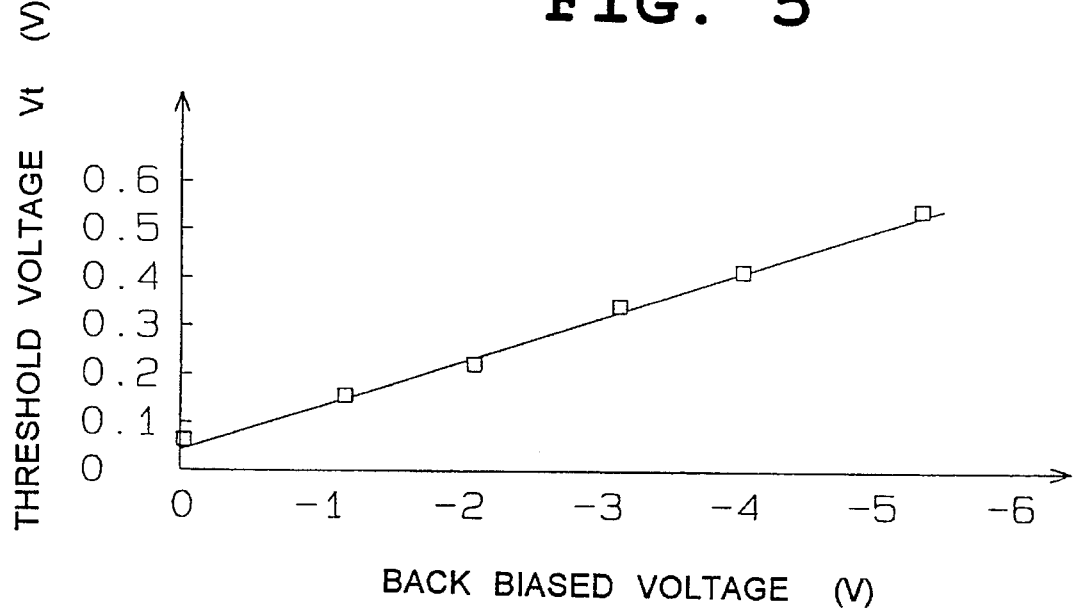
FIG. 5 is a characteristic diagram showing the relationship between back biased potentials and threshold voltages.

The substrate potentials of the N-channel type MOS transistors 2, 3, 4 and 5 are fixed to potentials which are proportionate to the distances thereof as shown in FIG. 4. In other words, the potential of the polycrystalline silicon layer 15 at the portion under each of the transistors 2, 3, 4 and 5 is determined by the resistance of the polycrystalline silicon layer 15 on a resistance division basis, and the substrate potential of each transistor is fixed accordingly. On the other hand, threshold voltages Vt of the N-channel type MOS transistors 2, 3, 4 and 5 linearly change relative to the substrate potentials (back biased voltages) as shown in FIG. 5. The transistors are arranged at equal intervals from each other so that the difference in the threshold voltages is equal between all combinations of two adjoining transistors. When an analog signal is applied to the common gate electrode 14 of the N-channel type MOS transistors 2, 3, 4 and 5 in such a state, each of the N-channel MOS type transistors 2, 3, 4 and 5 is turned on at timing in accordance with its threshold voltage Vt and an input voltage Vin as shown in Table 1 and outputs a digital value corresponding to the input signal.

TABLE 1

| Vin | Tr 2 | Tr 3 | Tr 4 | Tr 5 |
|---|---|---|---|---|
| 0 | OFF | OFF | OFF | OFF |
| 0.1 | ON | OFF | OFF | OFF |
| 0.2 | ON | ON | OFF | OFF |
| 0.3 | ON | ON | ON | OFF |
| 0.4 | ON | ON | ON | ON |

As apparent from the above, this configuration can be used for a flash type A-D converter.

A method of manufacturing an analog-to-digital converter having such a configuration will now be described. The analog-to-digital converter in the present embodiment is manufactured using substrate direct bonding. The description of manufacturing steps will be made on the area indicated by B in FIG. 3.

Figure 6:
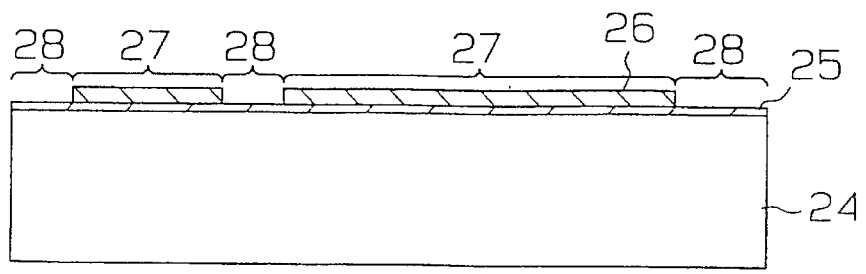
FIGS. 6 through 15 are sectional views for explaining manufacturing steps for the first embodiment.

First, a monocrystalline silicon substrate 24 as shown in FIG. 6 is provided, and a pad oxide film 25 is formed on the entire surface thereof. Further, a nitride film 26 is formed on the entire surface of the pad oxide film 25. The nitride film 26 is then patterned in an inverted mirror pattern of silicon regions (SOI regions) for elements to be formed later to remove the nitride film at the regions 28 which will serve as field portions.

Figure 7:
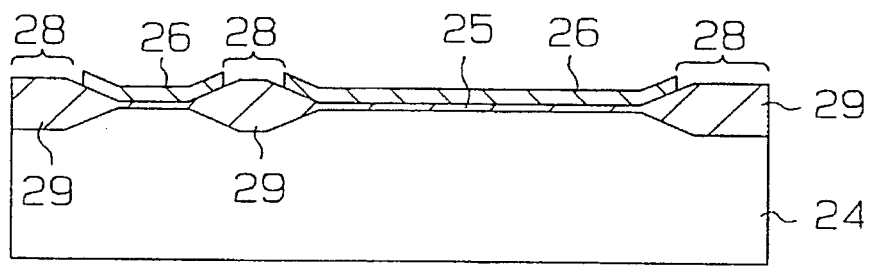
Figure 8:
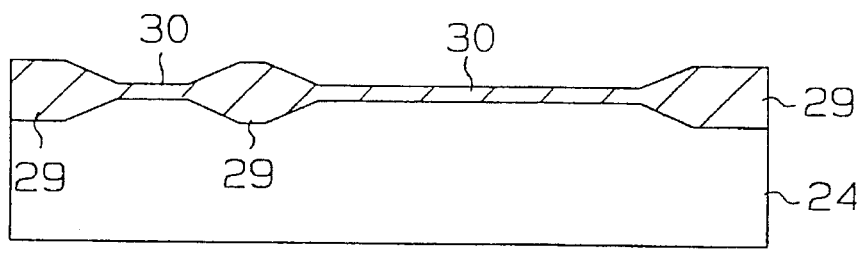

Thereafter, thermal oxidation is performed using the LOCOS method so that the thickness of oxide films 29 at the field portions 28 will become, for example, approximately 600 nm as shown in FIG. 7. Next, as shown in FIG. 8, after removing the nitride film 26 and the pad oxide film 25, the entire surface is thermally oxidized to form an oxide film 30 of, for example, approximately 300 nm on the silicon regions (SOI regions) 27.

Figure 9:
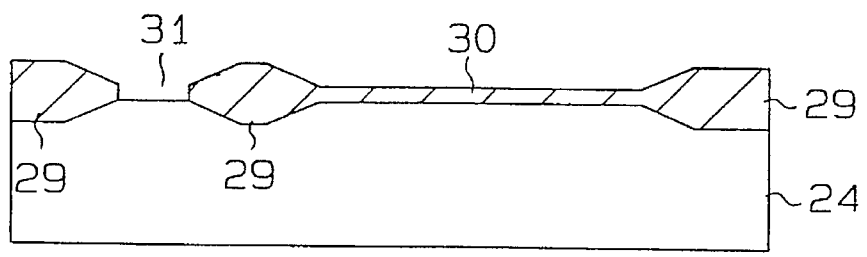

Further, after the oxide film 30 is patterned to form a contact hole as shown in FIG. 9, a contact hole 31 is formed by etching the film using, for example, reactive ion etching.

Figure 10:
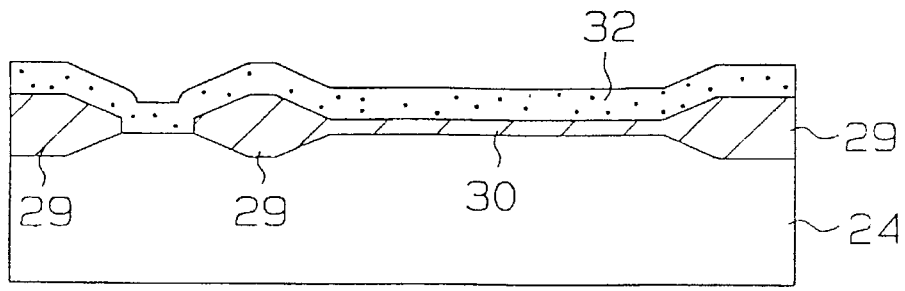
Figure 11:
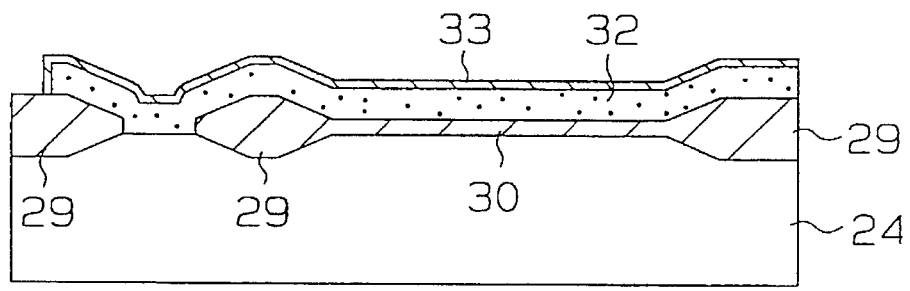
Figure 12:
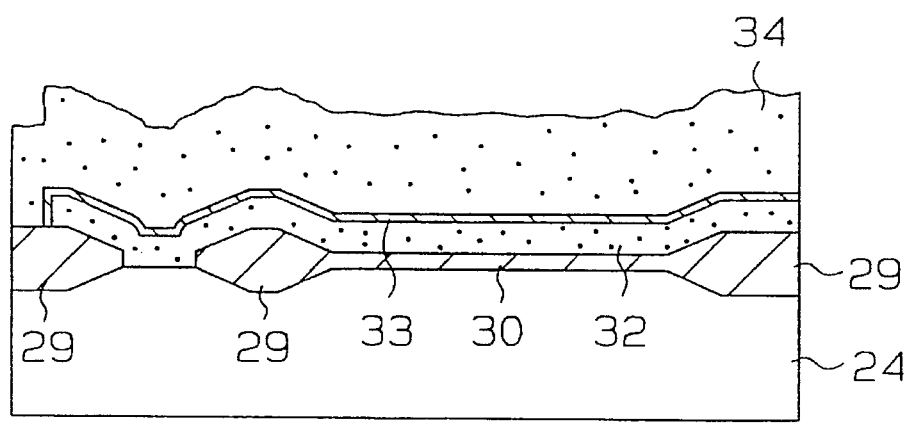
Figure 13:
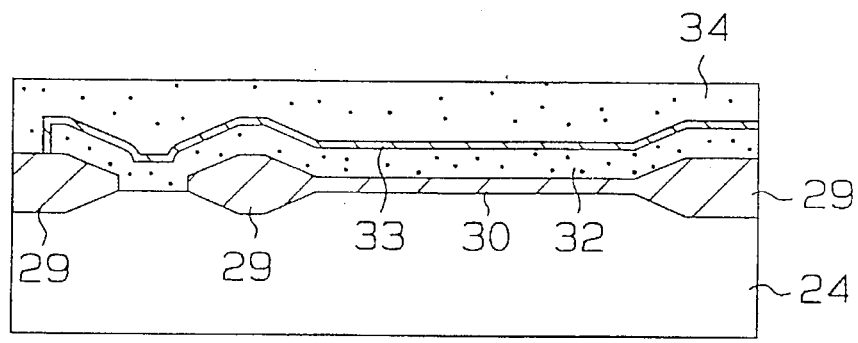

Next, a polycrystalline silicon layer 32 is deposited on the entire surface of the silicon substrate 24 as shown in FIG. 10. This polycrystalline silicon layer 32 is of a non-doped or N⁻ type. Then, as shown in FIG. 11, after the polycrystalline silicon layer 32 is patterned and etched to leave a desired region, an oxide film 33 having a thickness of approximately 100 nm is formed on the surface of the polycrystalline silicon layer 32 using, for example, thermal oxidation. In addition, a thick polycrystalline silicon layer 34 of a thickness of approximately 5 µm is deposited on the silicon substrate 24 as shown in FIG. 12, and the surface of the thick polycrystalline silicon layer 34 is flattened by polishing.

Figure 14:
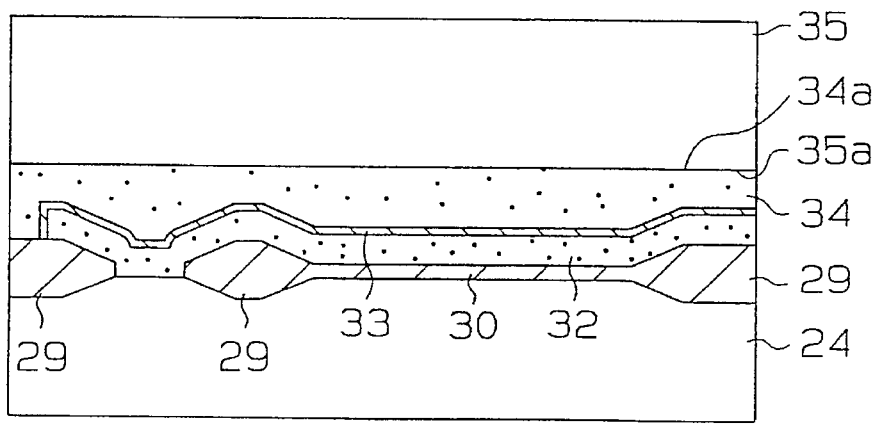
Figure 15:
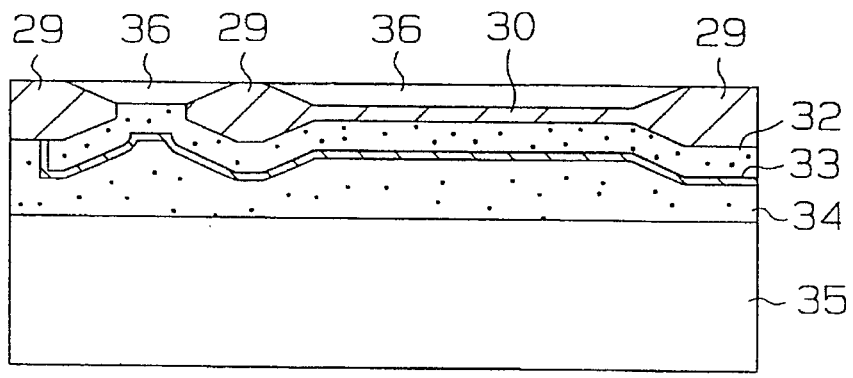

Next, as shown in FIG. 14, a mirror surface 35a of a monocrystalline substrate 35 and a polished surface 34a of the polycrystalline silicon layer 34 are brought into contact with each other, and the two substrates are directly joined and bonded, for example, by means of a heating process at 1,100 degrees centigrade for one hour in a nitrogen atmosphere. Then, as shown in FIG. 15, the monocrystalline silicon substrate 24 is selectively polished on the rear side thereof using the areas of the field oxide films 29 as a stopper for polishing to form thin film silicon layers (thin film SOI regions) 36. Finally, after the thickness of the SOI film and the impurity concentration in the SOI layers are adjusted, a gate electrode, a source region, a drain region, a layer insulation film and a metal electrode are formed on the thin film silicon layer (thin film SOI region) 36 as shown in FIG. 3 using a normal MOS-IC process to complete the device.

As described above and shown in FIGS. 1 to 3, according to the present embodiment, the four MOS transistors 2, 3, 4 and 5 of the same design and structure are provided on the same substrate 1; the polycrystalline silicon layer (conductive layer) 15 extends under the MOS transistors 2, 3, 4 and 5 in the substrate 1; and the predetermined voltage is applied to the polycrystalline silicon layer 15. As a result, the substrate (channel-well region) potentials of the MOS transistors 2, 3, 4 and 5 are fixed to different values which depend on the potentials of the polycrystalline silicon layer 15 at the areas under the respective transistors. This allows the threshold voltages Vt of the MOS transistors 2, 3, 4 and 5 to be continuously controlled and, when the analog signal is input to the gate terminals of the MOS transistors 2, 3, 4 and 5, the signal is digitized in accordance with the on and off states of the MOS transistors 2, 3, 4 and 5.

The prior art wherein such threshold voltages Vt are changed by changing the gate lengths and gate widths of transistors has resulted in problems when a multiplicity of transistors having different gate lengths and gate widths are provided in the same substrate in that the layout design becomes complicated and in that the smallest transistor must meet the minimum design rules, which means that the surface area of the chip must be increased to provide transistors of larger sizes. According to the present embodiment, however, the MOS transistors 2, 3, 4 and 5 which are identical in their structures can be provided on the same substrate 1. As a result, layout design is simplified, and all of the MOS transistors 2, 3, 4 and 5 can be designed to the minimum design rules, which makes it possible to maintain a small chip area. In addition, the number of MOS transistor stages can be increased with a minimum increase in the chip area. This makes it possible to provide a converter of high resolution in a small chip area.

(Second Embodiment)

A second embodiment of the present invention will now be described emphasizing on differences from the first embodiment.

Figure 16:
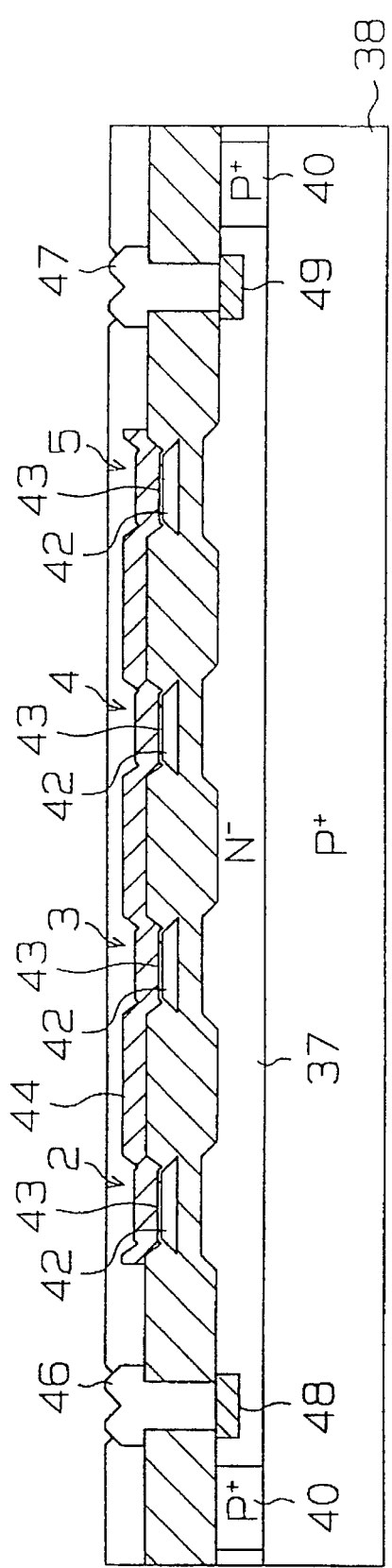
FIG. 16 is a sectional view of a second embodiment of the present invention.

Although a thin film SOI structure is obtained by laminating two substrates in the above-described first embodiment, as shown in FIG. 16, a thin film SOI structure is obtained using a method of burying an insulating layer through ion implantation (SIMOX method) in the present embodiment.

The manufacturing method will now be described.

Figure 17:
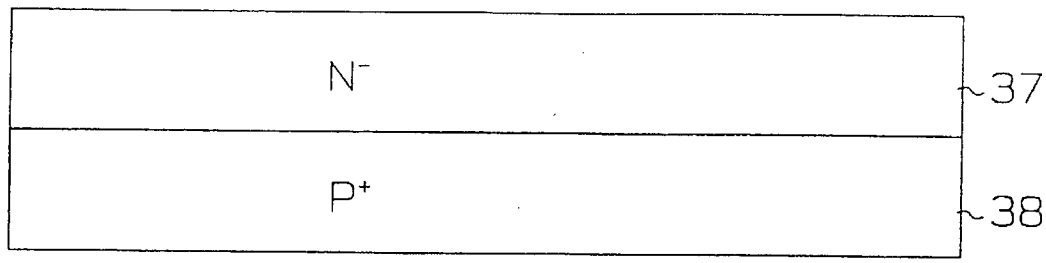
FIGS. 17 through 22 are sectional views for explaining manufacturing steps for the second embodiment.
Figure 18:
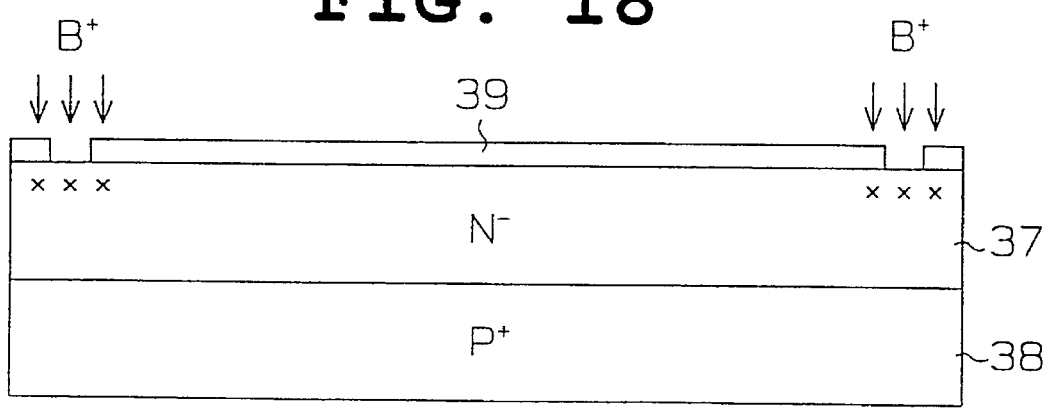

As shown in FIG. 17, a $P^+$ ($10^{18}$ $cm^{-3}$ or more) silicon substrate 38 having an $N^-$ ($10^{16}$ $cm^{-3}$ or less) epitaxial layer 37 of approximately 10 to 50 μm is prepared. As shown in FIG. 18, boron ions are implanted at 150 keV and $1\times10^{16}$ $cm^{-2}$ using a photoresist 39 as a mask in areas which form $P^+$ regions for isolating elements.

Figure 19:
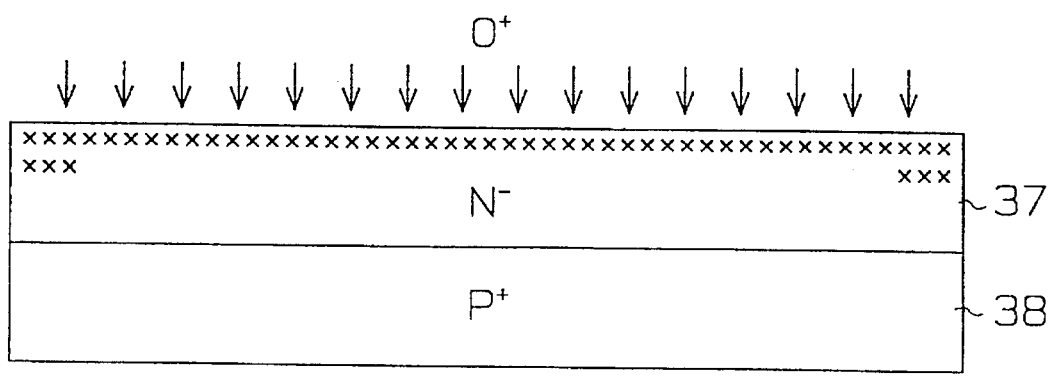
Figure 20:
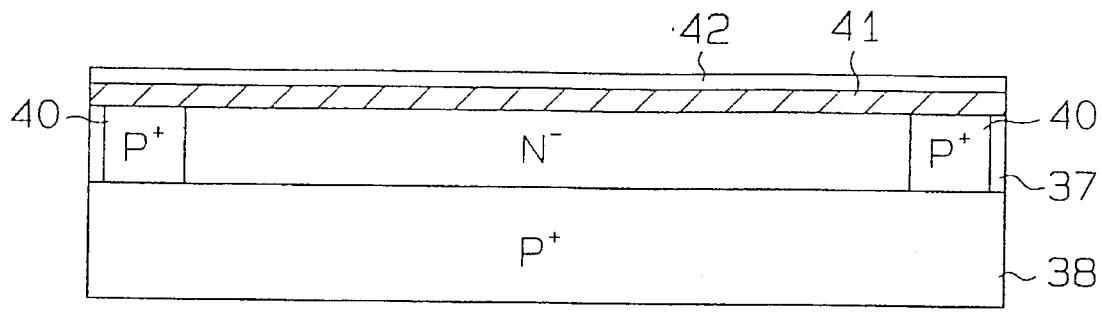

Next, oxygen ions are implanted at 150 keV and $1.3\times10^{18}$ $cm^{-2}$ on the entire surface of the wafer to form the separation layer of the oxide film as shown in FIG. 19. Thereafter, as shown in FIG. 20, annealing is performed at 1,300 degrees centigrade for six hours to activate a device isolating layers. As a result, $P^+$ diffused layers 40 for isolating devices, a $SiO_2$ layer 41 and a thin film silicon layer 42 are formed. The formation of electrode portions of the substrate is completed at this stage.

Figure 21:
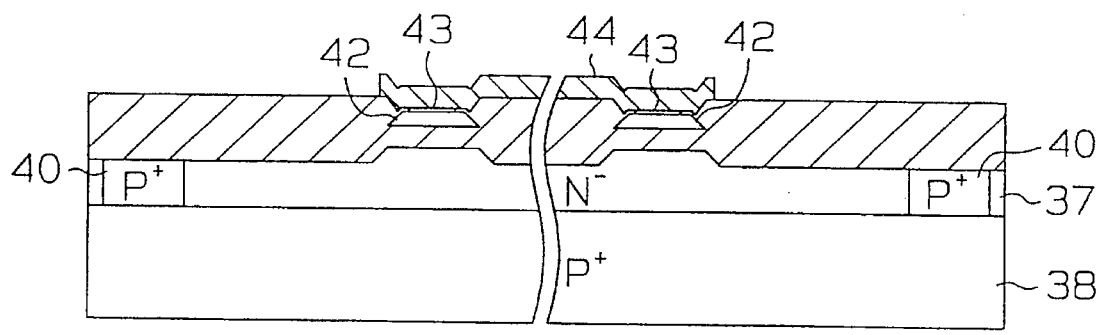
Figure 22:
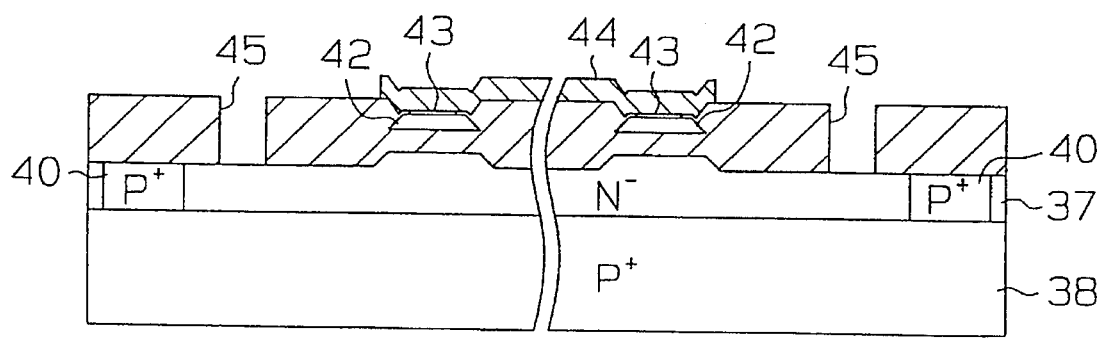

Then, as shown in FIG. 21, a normal MOS process is carried out to perform LOCOS (local isolation of silicon) isolation and to form a gate oxide film 43 and a gate polycrystalline silicon electrode 44. Finally, after through holes 45 for forming the substrate electrodes are formed in the LOCOS oxide film, as shown in FIG. 22, ion implantation into source and drain regions are performed; a layer insulating film is formed; and aluminum is deposited in the through holes 45.

As a result, aluminum electrodes 46 and 47 are electrically connected to the $N^-$ epitaxial layer 37 as a conductive layer through $N^+$ diffused layers 48 and 49 as shown in FIG. 16. The $N^+$ diffused layers 48 and 49 are formed at the same time when the ion implantation into the source and drain is performed.

(Third Embodiment)

A third embodiment of the present invention will now be described.

The present embodiment is an application of the present invention to a two-bit analog-to-digital converter.

Figure 23:
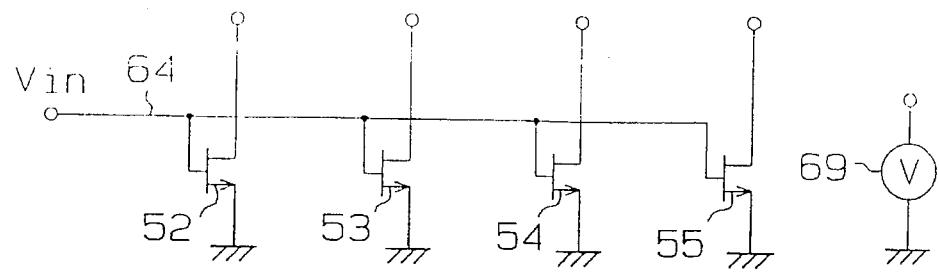
FIG. 23 is an electrical circuit diagram of a third embodiment of the present invention.
Figure 24:
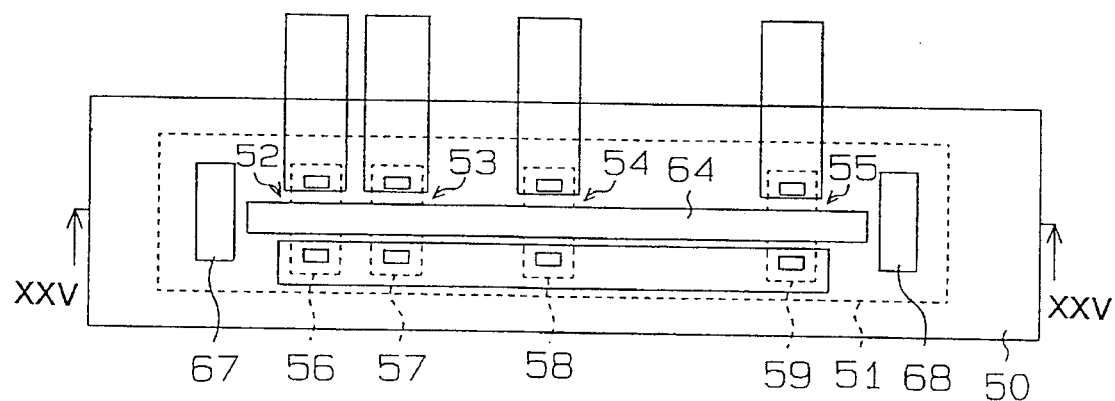
FIG. 24 is a plan view of a chip according to the third embodiment.
Figure 25:
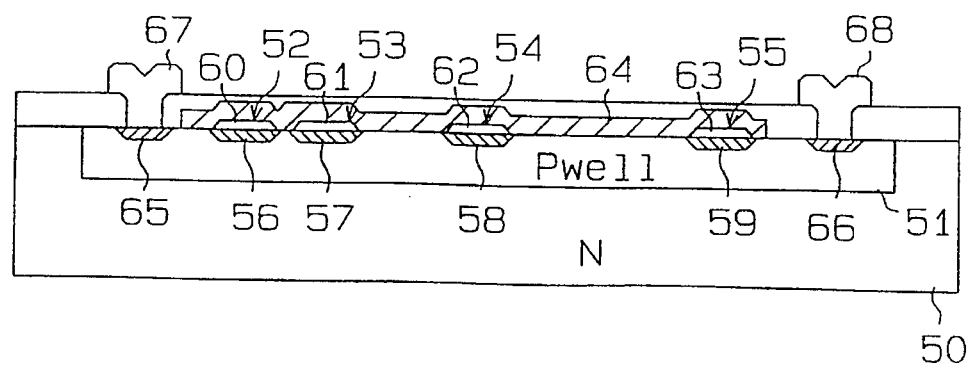
FIG. 25 is a sectional view taken along the line XXV—XXV in FIG. 24.

FIG. 23 shows an electrical configuration. FIG. 24 shows a plan view of a substrate. FIG. 25 shows a sectional view taken along the line XXV—XXV in FIG. 24. Although the substrates in the first and second embodiments have SOI structures, a bulk structure is employed in the present embodiment as shown in FIG. 25.

A P well region 51 is formed on an N-type silicon substrate 50. In the P well region 51, four N-channel type MOS transistors 52, 53, 54 and 55 having the same structure are provided in a line. Specifically, four pairs of N-type diffused layers 56, 57, 58 and 59 are formed on the surface of the N-type silicon substrate 50, and, a common gate electrode 64 common to those transistors extends on the N-type diffused layers 56, 57, 58 and 59 with gate oxide films 60, 61, 62 and 63 interposed therebetween. The P well region 51 serves as a conductive layer for adjusting threshold voltages Vt of the N-channel type MOS transistors 52, 53, 54 and 55.

Aluminum electrodes 67 and 68 are electrically connected through N-type diffused layers 65 and 66 to both sides of the area of the P well region 51 wherein the N-channel type transistors 52, 53, 54 and 55 are provided.

Figure 26:
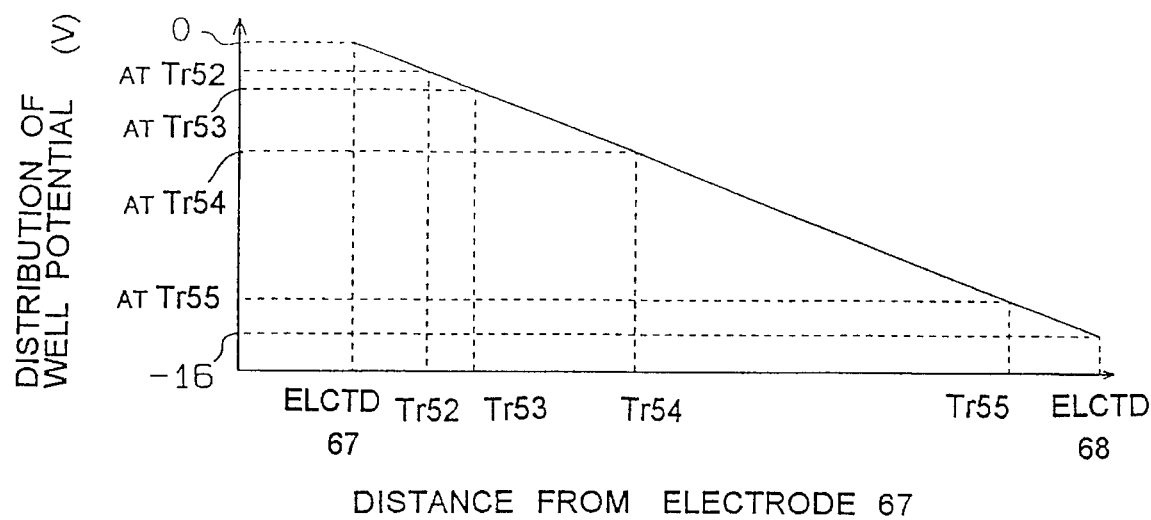
FIG. 26 is a characteristic diagram showing the relationship between the positions and well potentials of transistors.
Figure 27:
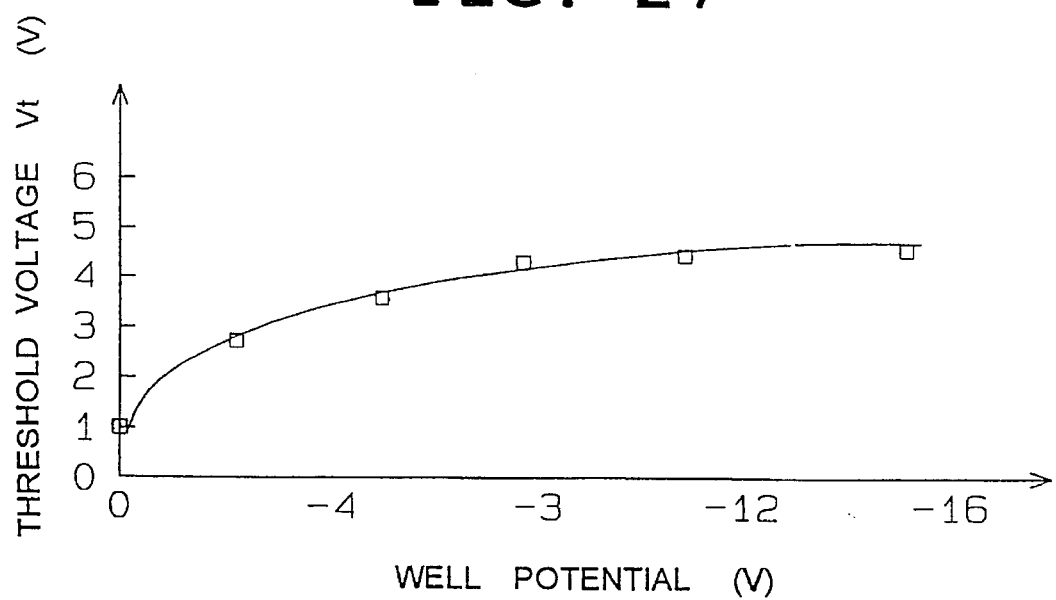
FIG. 27 is a characteristic diagram showing the relationship between well potentials and threshold voltages.

A ground potential is provided at the aluminum electrode 67, and the aluminum electrode 68 is connected to a bias power supply 69 (see FIG. 23). In the present embodiment, a constant power supply of −16 volts is used as the bias power supply 69. At this time, the well potentials of the N-channel type MOS transistors 52, 53, 54 and 55 are distributed and fixed to the distributed potentials which are proportionate to the distances thereof as shown in FIG. 26. On the other hand, the threshold voltages Vt of the N-channel type MOS transistors 52, 53, 54 and 55 are proportionate to the square roots of the well potentials thereof. The N-channel type MOS transistors 52, 53, 54 and 55 are arranged so that the difference in the threshold voltages Vt is equal between all combinations of adjoining N-channel type MOS transistors (see FIG. 24 and FIG. 25). When an analog signal is applied to the common gate electrode 64 of the N-channel type MOS transistors 52, 53, 54 and 55 in such a state, each of the N-channel type MOS transistors 52, 53, 54 and 55 is turned on in accordance with its threshold voltage Vt and an input voltage Vin as shown in Table 2 and outputs a digital value corresponding to the input signal.

TABLE 2

| Vin | Tr 52 | Tr 53 | Tr 54 | Tr 55 |
|---|---|---|---|---|
| 0 | OFF | OFF | OFF | OFF |
| 1 | ON | OFF | OFF | OFF |
| 2 | ON | ON | OFF | OFF |
| 3 | ON | ON | ON | OFF |
| 4 | ON | ON | ON | ON |

As apparent from the above, this configuration can be used for a flash type A-D converter. Further, if the N-channel type MOS transistors 52, 53, 54 and 55 are not arranged so that the difference in the threshold voltages Vt is equal between all combinations of adjoining transistors, the present embodiment can be used as a non-linear converter.

(Fourth Embodiment)

A fourth embodiment of the present invention will now be described.

Although only N-channel type MOS transistors have been discussed in the description of the embodiments so far, the present invention can be similarly embodied in a complementary MOS (CMOS) inverter.

Specifically, a configuration is possible, wherein a plurality of MOS transistors of a CMOS inverter structure having the same layout are disposed on the same substrate; a conductive layer extends under the MOS transistors having a CMOS inverter structure in the substrate; threshold voltages of the MOS transistors having a CMOS inverter structure are continuously controlled by applying a predetermined voltage to the conductive layer; and an analog signal is input to gate terminals of the MOS transistors and is digitized in accordance with on and off states of the MOS transistors.

In this case, by applying the predetermined voltage to the conductive layer, the substrate (channel-well region) potentials are continuously controlled to thereby continuously control threshold voltages of the MOS transistors having a CMOS inverter structure. The analog signal is input to the gate terminals of the CMOS transistors and is digitized in accordance with the on and off states of the CMOS transistors. Thus, CMOS transistors of the same design and structure can be provided on the same substrate. This facilitates the designing of the layout. In addition, since the CMOS transistors have the same structure, all of the MOS transistors can be designed in accordance with the minimum design rules, which allows the chip area to be kept small.

(Fifth Embodiment)

Figure 28:
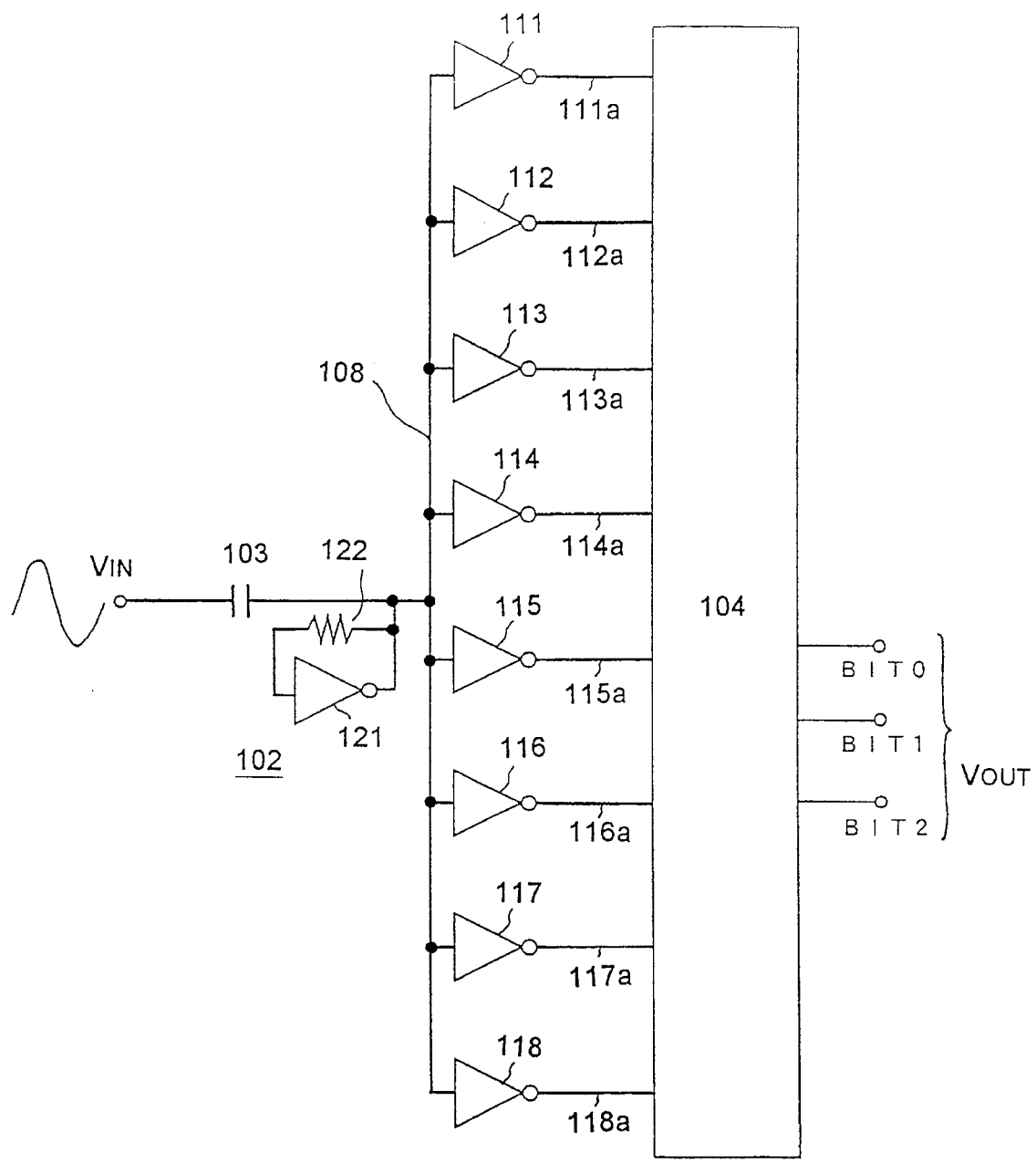
FIG. 28 is an electrical circuit diagram of a fifth embodiment of the present invention.
Figure 29:
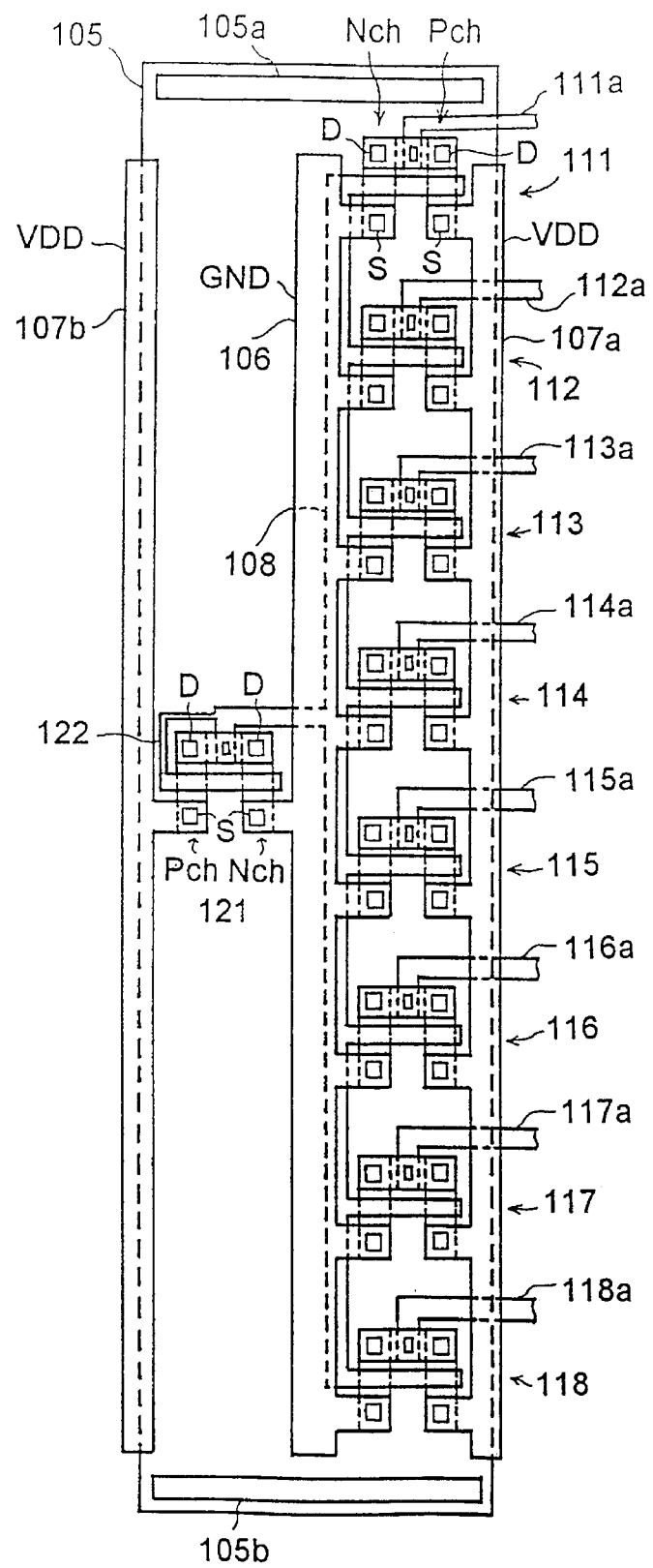
FIG. 29 is a plan view of major parts of a chip according to the fifth embodiment.

A fifth embodiment of the present invention will now be described. The present embodiment is suitable for performing analog-to-digital conversion on a high frequency analog waveform. FIG. 28 shows an electrical circuit diagram thereof. FIG. 29 is a plan view of a chip showing the layout of an inverter portion.

The present embodiment is comprised of complementary MOS (CMOS) inverters 111 to 118 having the same shape constituted by thin film transistors whose threshold voltages Vt are controlled by a buried electrode 105 (refer to above-described embodiments), a CMOS inverter 121 having the same shape as those inverters, a resistor 122 which constitutes a bias circuit 102 in combination with the inverter 121, a capacitor 103 and an encoder 104 for converting digital values output by the inverters 111 through 118 into binary codes. As shown in the plan view in FIG. 29, the inverters 111 to 118 and 121 are designed in the same structure. Each of those inverters is constituted by an SOI layer comprised of a P-channel transistor and an N-channel transistor which are independent of each other on one buried layer 105 (corresponding to, for example, the polycrystalline silicon layer 15 in the first embodiment) and is arranged so that the channel regions of the P-channel type and N-channel type MOS transistors are in the same position between two electrodes 105a and 105b of the buried electrode 105. As well known in the art, in each of the inverters 111 to 118 and 121, the source of the N-channel type MOS serves as the ground and is connected to a common ground surface electrode 106; the source of the P-channel type MOS is connected to common VDD surface electrodes 107a and 107b; and the connection point between the drains of the P-channel type MOS and the N-channel type MOS serves as the output of the inverter. The output of the inverter 121 is connected to a common gate line 108 and fed back to the gate line thereof through the resistor 122. In the inverters 111 to 118, a high frequency analog signal input through the capacitor 103 (FIG. 28) is commonly gated by the common gate line 108 as Vin. Output lines 111a to 118a from the respective inverters 111 to 118 are connected to the encoder 104 (FIG. 28). The inverters 111 to 118 are arranged so that their channel regions are equally spaced between the electrodes 105a and 105b while the inverter 121 is arranged so that the channel region thereof is positioned midway between the electrodes 105a and 105b, i.e., so that the gate electrode thereof is set midway between the gate electrodes of the inverters 111 and 118.

The operation of this configuration will now be described.

As in the first embodiment, substrate potentials (channel-well region potentials) of the inverters 111 to 118 are biased by the buried electrode 105 so that the differences between the threshold values Vt of those inverters are equal to each other. Further, the output voltage of the inverter 121 is equal to the threshold voltage Vt thereof because feedback is provided to the input thereof by the resistor 122. Since the inverter 121 is positioned midway between the inverters 111 and 118, the voltage Vt thereof is equal to the intermediate potential between the threshold voltages Vt of the inverters 111 and 118. Therefore, the common gate line 108 for the inverters 111 to 118 is fixed to the intermediate potential between those of the inverters 111 and 118. If the high frequency analog signal is input to the capacitor 103 in such a state, the potential of the common gate 108 for the inverters 111 to 118 fluctuates about the intermediate potential. At this time, the on and off states of the inverters 111 to 118 are discriminated based on this fluctuating potential, and the on and off states are output to the signal lines 111a to 118a as digital signals which are converted into normal binary data by the encoder 104.

As described above, the high frequency analog signal can always fluctuate in the middle of the input range of the A-D converter, which enables the operation without adjustment using external circuits.

The buried conductive layer may be provided to each of the transistors to bias different potentials to the MOS transistors.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An analog-to-digital converter, comprising:

a plurality of semiconductor islands disposed on a substrate with an insulating film interposed therebetween, said semiconductor islands being isolated from each other;

a plurality of MOS transistors formed within respective ones of said semiconductor islands;

a conductive layer disposed to be positioned under said semiconductor islands and isolated from each of said semiconductor islands, said conductive layer having a potential distribution therewithin and thereby applying different potentials to said semiconductor islands, whereby threshold voltages of said MOS transistors are differentiated from each other;

an analog signal input portion commonly connected to gates of said MOS transistors for inputting an analog signal to said gates of said MOS transistors; and a coded signal output portion comprising output terminals of said MOS transistors.

2. An analog-to-digital converter according to claim 1, wherein said conductive layer is formed of a single layer and is applied with different potentials at two ends thereof.

3. An analog-to-digital converter according to claim 2, wherein each of said MOS transistors has a structure of a complementary MOS inverter.

4. An analog-to-digital converter according to claim 1, wherein each of said MOS transistors has a structure of a complementary MOS inverter.

5. An analog-to-digital converter according to claim 1, wherein said plurality of semiconductor islands are aligned on said insulating film.

6. An analog-to-digital converter according to claim 5, wherein said plurality of semiconductor islands are aligned at even intervals.

7. An analog-to-digital converter according to claim 6, wherein said conductive layer comprises a buried electrode disposed within said insulating film, having a belt configuration which extends below all of said semiconductor islands and along an aligning direction of said semiconductor islands.

8. An analog-to-digital converter according to claim 6, wherein said conductive layer comprises a semiconductor region provided at a surface of said substrate, being isolated from another region of said substrate by means of pn isolation.

9. An analog-to-digital converter, comprising:

a plurality of semiconductor islands disposed on a substrate with an insulating film interposed therebetween, said semiconductor islands being isolated from each other;

an input terminal for inputting an analog signal;

a plurality of MOS transistors formed within respective ones of said semiconductor islands and having the same structure, gates of said plurality of MOS transistors being connected to said input terminal to be provided with said analog signal as a common gate signal;

a channel potential setting means for fixing potentials of channel regions of said plurality of MOS transistors to different potentials to thereby differentiate thresholds of said MOS transistors from each other, said channel potential setting means including a buried electrode disposed to extend under all of said channel regions of said MOS transistors and within said insulating film, an end of said buried electrode being connected to a constant potential, and distances from a connection point to areas under said channel regions of said MOS transistors being different from each other; and a plurality of output lines respectively connected to said MOS transistors, and through which on and off states of said MOS transistors are output in accordance with said analog signal.

10. An analog-to-digital converter according to claim 9, wherein differences between said distances of adjoining areas under said adjoining MOS transistors are equal to each other.

11. An analog-to-digital converter according to claim 9, wherein said MOS transistors are complementary MOS inverters.

12. An analog-to-digital converter according to claim 9, wherein said plurality of semiconductor islands are aligned on said insulating film.

13. An analog-to-digital converter according to claim 12, wherein said plurality of semiconductor islands are aligned at even intervals.

14. An analog-to-digital converter according to claim 12, wherein said buried electrode has a belt configuration which extends below all of said semiconductor islands and along an aligning direction of said semiconductor islands.

* * * * *